US012643495B2

(12) United States Patent
Baba et al.

(10) Patent No.: US 12,643,495 B2
(45) Date of Patent: Jun. 2, 2026

(54) POWER SUPPLY SYSTEM

(71) Applicant: KABUSHIKI KAISHA TOYOTA JIDOSHOKKI, Aichi-ken (JP)

(72) Inventors: Satoru Baba, Kariya (JP); Takahiro Suzuki, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 271 days.

(21) Appl. No.: 18/659,286

(22) Filed: May 9, 2024

(65) Prior Publication Data

US 2024/0383418 A1    Nov. 21, 2024

(30) Foreign Application Priority Data

May 17, 2023    (JP) ................................. 2023-081626

(51) Int. Cl.
 *B60R 16/023*    (2006.01)
 *B60L 15/00*    (2006.01)
    (Continued)

(52) U.S. Cl.
 CPC ........ *B60R 16/0238* (2013.01); *B60L 15/007* (2013.01); *B60L 15/12* (2013.01);
    (Continued)

(58) Field of Classification Search
 CPC ........ H02M 7/003; H02M 1/44; H02M 3/003; H02M 7/493; Y02T 10/70; H02K 11/33; H02K 5/225; H02K 5/04; H05K 7/209; H05K 5/0247; H05K 7/14329; H05K 7/1427; H05K 2201/10166; H05K 7/2089; H05K 5/0026; Y02E 60/10; Y02E 60/13; B60L 2210/40; B60L 2210/30;
(Continued)

(56) References Cited

U.S. PATENT DOCUMENTS 9,756,755 B2 *    9/2017    Harada .............. H05K 7/14329
10,826,045 B2 *    11/2020    Sato .................... H01M 50/298
(Continued)

FOREIGN PATENT DOCUMENTS

JP    2018-065513 A    4/2018

OTHER PUBLICATIONS

Takeuchi et al., Power Supply/Distribution Device, Apr. 11, 2024, PE2E search Translation (Year: 2024).*

*Primary Examiner* — Michael A Matey
(74) *Attorney, Agent, or Firm* — Greenblum & Bernstein, P.L.C.

(57) ABSTRACT

A power supply system includes a power conversion device, a battery unit that is electrically connected to the power conversion device via a wiring, and a case. The case includes a first case portion that defines a first internal space for housing the power conversion device, a second case portion that defines a second internal space for housing the battery unit, and a partition wall portion that separates the first internal space and the second internal space from each other and has a connecting hole that connects the first internal space and the second internal space to each other. The first case portion has an opening portion that opens downward. The connecting hole is positioned above the opening portion. The power supply system further comprising a lid member that is capable of opening and closing the opening portion.

6 Claims, 2 Drawing Sheets

(51) Int. Cl.

| | |
|---|---|
| *B60L 15/12* | (2006.01) |
| *B60L 50/60* | (2019.01) |
| *B60L 58/26* | (2019.01) |
| *H05K 7/20* | (2006.01) |

(52) U.S. Cl.
CPC ............... *B60L 50/66* (2019.02); *B60L 58/26* (2019.02); *H05K 7/20945* (2013.01)

(58) Field of Classification Search
CPC .... B60L 50/51; B60L 2240/525; B60L 50/60; B60L 2210/10; B60L 3/003; B60L 50/66; B60R 16/03; B60R 16/0239; H01M 2220/20; B60K 1/04; B60Y 2200/91; B60Y 2200/92; B60Y 2200/30; H01G 11/78; H01G 2/10; H02G 3/081; Y10S 903/903

See application file for complete search history.

(56) References Cited

U.S. PATENT DOCUMENTS

| | | | | |
|---|---|---|---|---|
| 2012/0200164 A1* | 8/2012 | Nakatsu | ................ | H02M 7/003 307/9.1 |
| 2012/0250380 A1* | 10/2012 | Ichijyo | ............... | H05K 7/20927 363/123 |
| 2013/0223009 A1* | 8/2013 | Nakatsu | ................ | H02M 7/003 361/699 |
| 2014/0319909 A1* | 10/2014 | Suzuki | .................... | B60L 50/66 307/10.1 |
| 2015/0246619 A1* | 9/2015 | Nagao | .................... | B60L 53/24 307/10.1 |
| 2016/0126802 A1* | 5/2016 | Nagao | ...................... | H02K 5/22 310/71 |
| 2018/0111501 A1* | 4/2018 | Takeuchi | ................ | B60L 50/66 |
| 2018/0198350 A1* | 7/2018 | Ambo | ................. | H03H 7/0115 |
| 2019/0098777 A1* | 3/2019 | Nakatsu | ................ | H02M 7/003 |
| 2019/0159367 A1* | 5/2019 | Umino | .............. | H05K 7/20927 |
| 2019/0320549 A1* | 10/2019 | Song | ................... | H05K 5/0026 |
| 2021/0006124 A1* | 1/2021 | Kobayashi | ............. | B60R 16/03 |
| 2022/0158566 A1* | 5/2022 | Seki | ....................... | H02M 7/003 |
| 2022/0271683 A1* | 8/2022 | Houda | .................. | H02M 7/003 |
| 2023/0059509 A1* | 2/2023 | Mima | .................. | H02M 7/003 |
| 2023/0396183 A1* | 12/2023 | Katsube | ................ | H02M 7/003 |
| 2024/0213887 A1* | 6/2024 | Matsuoka | ............. | H02M 7/537 |
| 2024/0268086 A1* | 8/2024 | Nishikimi | .......... | H02M 7/5387 |
| 2024/0275297 A1* | 8/2024 | Araki | ................... | H02M 7/003 |
| 2025/0192690 A1* | 6/2025 | Shioura | ................ | H02M 1/327 |
| 2025/0211094 A1* | 6/2025 | Takada | ................... | H02P 27/08 |

* cited by examiner

UP

FRONT ←——————→ REAR

DOWN

POWER SUPPLY SYSTEM

CROSS-REFERENCE TO RELATED APPLICATIONS

This application is based upon and claims the benefit of priority from prior Japanese Patent Application No. 2023-081626, filed on May 17, 2023, the entire contents of which are incorporated herein by reference.

BACKGROUND

1. Field

The present disclosure relates to a power supply system.

2. Description of Related Art

There is known a power supply system including a power conversion device, a battery unit electrically connected to the power conversion device via a wiring, and a case. The case includes, for example, a first internal space that houses the power conversion device and a second internal space that houses the battery unit.

Further, the case described in Japanese Laid-Open Patent Publication No. 2018-65513 includes a partition wall portion that separates the first internal space and the second internal space from each other.

When the case described in the above patent is employed as the case of the power supply system, it is necessary to form a connecting hole that connects the first internal space and the second internal space to each other in the partition wall portion. Further, a wiring extending between the first internal space and the second internal space via the connecting hole is provided. In this case, if water enters the first internal space from the outside of the case, the water may leak from the first internal space to the second internal space via the connecting hole.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power supply system includes a power conversion device, a battery unit that is electrically connected to the power conversion device via a wiring, and a case. The case includes a first case portion that defines a first internal space for housing the power conversion device, a second case portion that defines a second internal space for housing the battery unit, and a partition wall portion that separates the first internal space and the second internal space from each other and has a connecting hole that connects the first internal space and the second internal space to each other. The wiring extends between the first internal space and the second internal space via the connecting hole. The first case portion has an opening portion that opens downward. The connecting hole is positioned above the opening portion. The power supply system further comprising a lid member that is capable of opening and closing the opening portion.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, except for operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

Hereinafter, a power supply system 10 according to one embodiment will be described. The power supply system 10 of the present embodiment is mounted on a passenger car, which is a vehicle.

Mounting Location of Power Supply System

Figure 1:
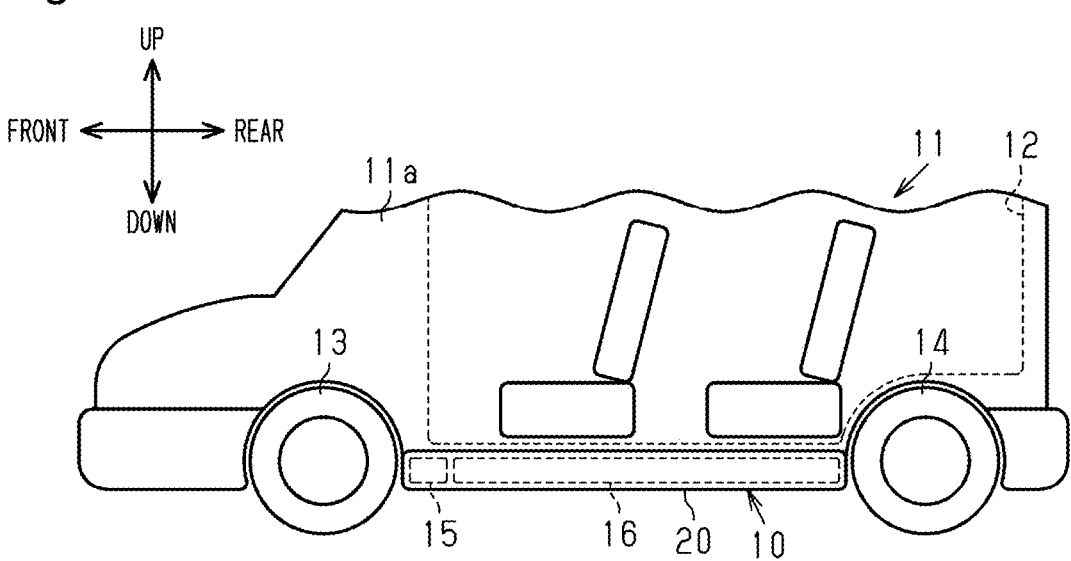
FIG. 1 is a schematic diagram showing a passenger car and a power supply system according to an embodiment.

As shown in FIG. 1, the power supply system 10 of the present embodiment supplies electric power to a passenger car 11, which is a vehicle. The passenger car 11 of the present embodiment is a battery-powered electric vehicle. The power supply system 10 is positioned in a lower part of the passenger car 11. In the following description, directions represented by terms such as "front", "rear", "up", "down", "right", and "left" are defined with reference to the passenger car 11. The front-rear direction of the passenger car 11 is also simply referred to as a front-rear direction, the up-down direction of the passenger car 11 is also simply referred to as an up-down direction, and the left-right direction of the passenger car 11 is also simply referred to as a left-right direction.

The power supply system 10 is positioned below a passenger compartment 12. The power supply system 10 is positioned between front wheels 13 and rear wheels 14 of the passenger car 11. The power supply system 10 is fixed to a vehicle body 11a of the passenger car 11 so as to be exposed to the outside of the passenger car 11.

Basic Configuration of Power Supply System

Figure 2:
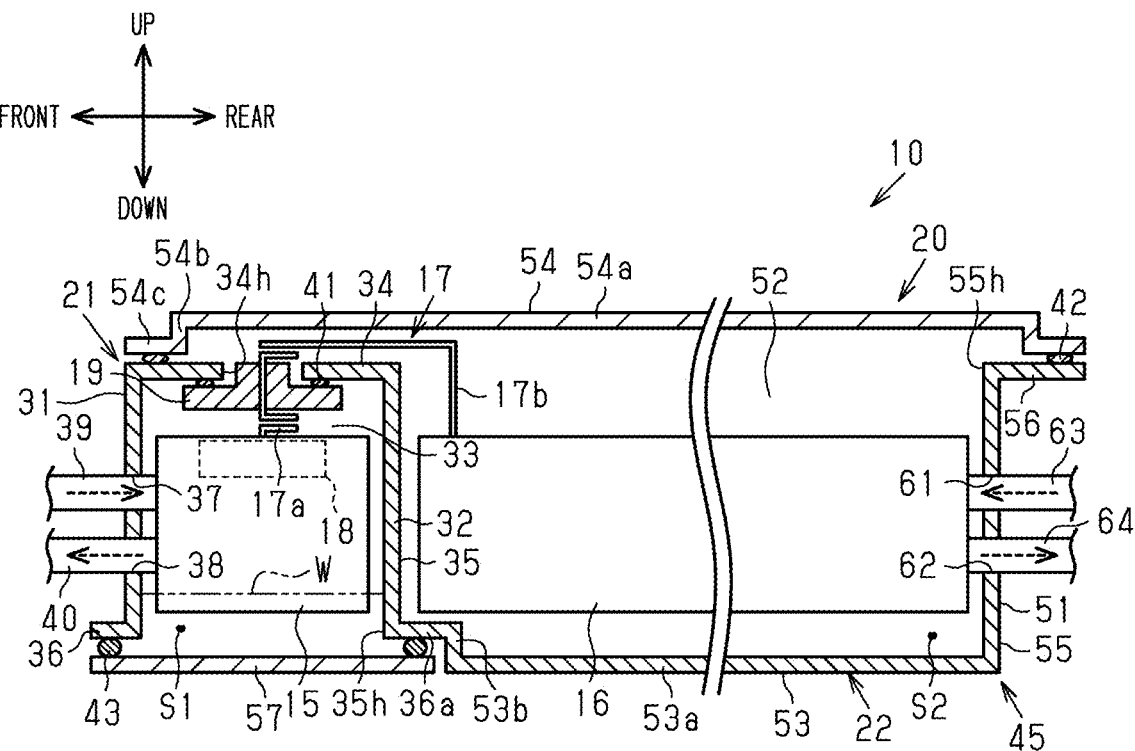
FIG. 2 is a cross-sectional view showing the power supply system of FIG. 1.

As shown in FIG. 2, the power supply system 10 includes a power conversion device 15, a battery unit 16, and a case 20. The battery unit 16 is electrically connected to the power conversion device 15 via a wiring 17. The battery unit 16 is, for example, a rechargeable battery or an electric double-layer capacitor. The wiring 17 includes a first wiring 17a extending from the power conversion device 15 and a second wiring 17b extending from the battery unit 16.

The power conversion device 15 is supplied with electric power from an external power supply (not shown). The power conversion device 15 charges the battery unit 16 using the electric power. The external power supply is, for example, a commercial AC power supply. The power conversion device 15 includes an AC/DC converter (not shown). The AC/DC converter converts, for example, AC power supplied from the external power supply to the power conversion device 15 into DC power. The power conversion device 15 supplies DC power to the battery unit 16 via the wiring 17. The battery unit 16 is charged by the supply of the DC power from the power conversion device 15.

The power conversion device 15 includes a control unit (not shown). The control unit includes, for example, a processor and a storage unit. The processor may be, for example, a central processing unit (CPU), a graphics processing unit (GPU), or a digital signal processor (DSP). The storage unit includes a random-access memory (RAM) and a read-only memory (ROM). The storage unit stores program codes or instructions configured to cause the processor to execute processes. The storage unit, which is a computer-readable medium, includes any type of medium that is accessible by a general-purpose computer or a dedicated computer. The control unit may include a hardware circuit such as an application specific integrated circuit (ASIC) or a field programmable gate array (FPGA). The control unit, which acts as processing circuitry, may include one or more processors that run on computer programs, one or more hardware circuits such as an ASIC and an FPGA, or a combination of such devices.

The power conversion device 15 includes a relay 18. The relay 18 is switched between an ON state and an OFF state by the control unit of the power conversion device 15. When the relay 18 is in the ON state, electric power is supplied from the power conversion device 15 to the battery unit 16. When the relay 18 is in the OFF state, the supply of electric power from the power conversion device 15 to the battery unit 16 is stopped. In this way, the relay 18 switches between execution and stop of supply of electric power from the power conversion device 15 to the battery unit 16. The relay 18 of the present embodiment is positioned at an upper portion in the power conversion device 15.

As shown in FIG. 1, the case 20 houses the power conversion device 15 and the battery unit 16. The case 20 is fixed to the vehicle body 11*a*, and thus the power supply system 10 is fixed to the vehicle body 11*a*. The power conversion device 15 and the battery unit 16 are arranged in the front-rear direction inside the case 20. The power conversion device 15 of the present embodiment is positioned forward of the battery unit 16.

Case

As shown in FIG. 2, a first internal space S1 for housing the power conversion device 15 and a second internal space S2 for housing the battery unit 16 are defined in the case 20. A portion of the case 20 that defines the first internal space S1 is referred to as first case portion 21, and a portion of the case 20 that defines the second internal space S2 is referred to as second case portion 22. The case 20 is made of, for example, metal.

First Case Portion

The first case portion 21 includes a first side wall 31, a second side wall 32, two third side walls 33, and an upper wall 34. The first side wall 31 is positioned forward of the power conversion device 15. The second side wall 32 is positioned behind the power conversion device 15. The first side wall 31 and the second side wall 32 each have, for example, a rectangular flat plate shape and are arranged so as to be orthogonal to the front-rear direction.

One of the two third side walls 33 is positioned on the right of the power conversion device 15, and the other of the two third side walls 33 is positioned on the left of the power conversion device 15. In FIG. 2, of the two third side walls 33, only the third side wall 33 positioned on the right of the power conversion device 15 is shown, and the third side wall 33 positioned on the left of the power conversion device 15 is not shown. Each of the two third side walls 33 has, for example, a rectangular flat plate shape, and is arranged so as to be orthogonal to the left-right direction.

A portion of the first case portion 21 that includes the first side wall 31, the second side wall 32, and the two third side walls 33 has a rectangular tubular shape extending in the up-down direction. This portion is also referred to as first tubular portion 35. The power conversion device 15 of the present embodiment is fixed to at least one of the first side wall 31, the second side wall 32, and the two third side walls 33, for example, by bolts (not shown).

The upper wall 34 is positioned above the power conversion device 15. The upper wall 34 has, for example, a rectangular flat plate shape and is arranged so as to be orthogonal to the up-down direction. The upper wall 34 and the power conversion device 15 are arranged apart from each other in the up-down direction. The upper wall 34 connects the upper ends of the first side wall 31, the second side wall 32, and the two third side walls 33. Thus, the upper opening of the first tubular portion 35 is covered by the upper wall 34. The upper wall 34 forms an upper portion of the first case portion 21.

The case 20 has a connecting hole 34*h*. The connecting hole 34*h* is provided in the upper wall 34 of the first case portion 21. The connecting hole 34*h* extends through the upper wall 34 in the up-down direction. The connecting hole 34*h* is, for example, a round hole. The connecting hole 34*h* is formed at the center of the upper wall 34 when the upper wall 34 is viewed in the up-down direction. The connecting hole 34*h* connects the first internal space S1 to the outside of the first case portion 21. The wiring 17 extends between the first internal space S1 and the second internal space S2 via the connecting hole 34*h*.

A terminal block 19 is provided in the first internal space S1. The terminal block 19 is fixed to, for example, the first case portion 21. The first wiring 17*a* and the second wiring 17*b* are connected to each other via the terminal block 19. The terminal block 19 is arranged at a position facing the connecting hole 34*h* in the up-down direction. The size of the terminal block 19 is larger than the size of the opening of the connecting hole 34*h* when viewed in the up-down direction.

A first seal member 41 is provided between the upper wall 34 and the terminal block 19. The first seal member 41 has the shape of an endless loop, and has, for example, a circular shape when viewed in the up-down direction. The first seal member 41 is provided around the connecting hole 34*h* of the upper wall 34. The first seal member 41 provides a seal between the upper wall 34 and the terminal block 19. Thus, the connecting hole 34*h* is closed from the inside of the first case portion 21 by the first seal member 41 and the terminal block 19.

The first case portion 21 includes a first supply port 37 and a first discharge port 38. Each of the first supply port 37 and the first discharge port 38 of the present embodiment is a through hole that extends through the first tubular portion 35. Each of the first supply port 37 and the first discharge port 38 of the present embodiment is provided in the first side wall 31.

A first supply pipe 39 is inserted into the first supply port 37. The first supply pipe 39 extends between the outside of the first case portion 21 and the first internal space S1 via the first supply port 37. A coolant is supplied from the outside of the first case portion 21 to the first internal space S1 via the first supply pipe 39. A downstream end of the first supply pipe 39 is connected to the power conversion device 15. Thus, the coolant is supplied from the first supply pipe 39 to the power conversion device 15. Various electronic components forming the power conversion device 15 are cooled by the coolant supplied from the first supply pipe 39 to the power conversion device 15. Therefore, the first supply port 37 corresponds to a supply port for supplying the coolant for cooling the power conversion device 15 from the outside of the first internal space S1 to the inside of the first internal space S1.

A first discharge pipe 40 is inserted into the first discharge port 38. The first discharge pipe 40 extends between the outside of the first case portion 21 and the first internal space S1 via the first discharge port 38. The coolant is discharged from the first internal space S1 to the outside of the first case portion 21 via the first discharge pipe 40. An upstream end of the first discharge pipe 40 is connected to the power conversion device 15. Thus, the coolant is discharged from the power conversion device 15 to the first discharge pipe 40. The coolant, after cooling the various electronic components forming the power conversion device 15, is discharged from the power conversion device 15 to the first discharge pipe 40. Therefore, the first discharge port 38 corresponds to a discharge port for discharging the coolant from the inside of the first internal space S1 to the outside of the first internal space S1. In the present embodiment, the coolant supplied to the first internal space S1 via the first supply port 37 and discharged from the first internal space S1 via the first discharge port 38 is, for example, a long life coolant (LLC).

The upstream end of the first supply pipe 39 and the downstream end of the first discharge pipe 40 may be connected to a first pump (not shown) and a first radiator (not shown). The coolant flows through the first supply pipe 39 and the first discharge pipe 40 by the driving of the first pump. The coolant is cooled by, for example, the relative wind of the passenger car 11 when flowing through the first radiator. The coolant may circulate, for example, through the first radiator, the first pump, the first supply pipe 39, the power conversion device 15, and the first discharge pipe 40 in that order.

The first case portion 21 includes a first flange portion 36 extending from the lower end of the first tubular portion 35. The first flange portion 36 has, for example, a rectangular frame shape when viewed from below. The first flange portion 36 extends, for example, so as to be orthogonal to the up-down direction. A portion of the first flange portion 36 extending from the lower end of the second side wall 32 is also referred to as second flange portion 36a.

The first case portion 21 has an opening portion 35h that opens downwards. The opening portion 35h has, for example, a rectangular shape. The opening portion 35h connects the first internal space S1, which is the inside of the first tubular portion 35, to the outside of the first case portion 21. The opening portion 35h is defined by the lower end of the first tubular portion 35. Since the connecting hole 34h is provided in the upper wall 34 of the first case portion 21, the connecting hole 34h is positioned above the opening portion 35h. The opening portion 35h is surrounded by the first flange portion 36. The size of the opening portion 35h formed in the first case portion 21 is set to a size that allows the power conversion device 15 to be taken out from the inside of the first case portion 21 to the outside of the case 20 via the opening portion 35h.

Second Case Portion

The second case portion 22 includes the upper wall 34, the second side wall 32, a fourth side wall 51, two fifth side walls 52, a lower wall 53, and a cover member 54. The second side wall 32 is positioned forward of the battery unit 16. The fourth side wall 51 is positioned behind the battery unit 16. The fourth side wall 51 has, for example, a rectangular flat plate shape and is arranged to be orthogonal to the front-rear direction.

One of the two fifth side walls 52 is positioned on the right of the battery unit 16, and the other of the two fifth side walls 52 is positioned on the left of the battery unit 16. In FIG. 2, of the two fifth side walls 52, only the fifth side wall 52 positioned on the right of the battery unit 16 is shown, and the fifth side wall 52 positioned on the left of the battery unit 16 is not shown. Each of the two fifth side walls 52 has, for example, a rectangular flat plate shape, and is arranged to be orthogonal to the left-right direction. A portion of the second case portion 22 that includes the second side wall 32, the fourth side wall 51, and the two fifth side walls 52 has a rectangular tubular shape extending in the up-down direction. This portion is also referred to as second tubular portion 55.

The lower wall 53 is positioned below the battery unit 16. The lower wall 53 includes a main body portion 53a, an extension portion 53b, and the second flange portion 36a. The lower wall 53 has, for example, a rectangular flat plate shape and is arranged to be orthogonal to the up-down direction. The second flange portion 36a forms a front portion of the lower wall 53. The extension portion 53b has, for example, a rectangular flat plate shape and extends from the main body portion 53a to be orthogonal to the front-rear direction. The extension portion 53b connects the front end of the main body portion 53a to the rear end of the second flange portion 36a.

The second flange portion 36a is connected to the lower end of the second side wall 32. The main body portion 53a is connected to the lower end of the fourth side wall 51. The main body portion 53a, the extension portion 53b, and the second flange portion 36a are connected to the two fifth side walls 52. Thus, the lower wall 53 connects the lower ends of the second side wall 32, the fourth side wall 51, and the two fifth side walls 52. The lower opening of the second tubular portion 55 is closed by the lower wall 53. The lower wall 53 forms a lower portion of the second case portion 22. The battery unit 16 of the present embodiment is fixed to at least one of the second side wall 32, the fourth side wall 51, the two fifth side walls 52, and the lower wall 53, for example, by bolts (not shown). The power conversion device 15 and the battery unit 16 are each fixed to the case 20 in a manner that the height of the upper end of the battery unit 16 and the height of the upper end of the power conversion device 15 are the same.

The second side wall 32 and the upper wall 34 form both a part of the first case portion 21 and a part of the second case portion 22. Therefore, the second side wall 32 and the upper wall 34 function as partition wall portions that separate the first internal space S1 and the second internal space S2 from each other. In other words, the case 20 includes the second side wall 32 and the upper wall 34, which are partition wall portions. The second side wall 32, which is a partition wall portion, connects the upper wall 34 of the first case portion 21 to the lower wall 53 of the second case portion 22. The connecting hole 34*h* is formed in the upper wall 34 which is a partition wall portion.

The second case portion 22 includes a second supply port 61 and a second discharge port 62. Each of the second supply port 61 and the second discharge port 62 of the present embodiment is a through hole that extends through the second tubular portion 55. Each of the second supply port 61 and the second discharge port 62 of the present embodiment is provided in the fourth side wall 51.

A second supply pipe 63 is inserted into the second supply port 61. The second supply pipe 63 extends between the outside of the second case portion 22 and the second internal space S2 via the second supply port 61. The coolant is supplied from the outside of the second case portion 22 to the second internal space S2 via the second supply pipe 63. A downstream end of the second supply pipe 63 is connected to the battery unit 16. Thus, the coolant is supplied from the second supply pipe 63 to the battery unit 16. The inside of the battery unit 16 is cooled by the coolant supplied from the second supply pipe 63 to the battery unit 16.

A second discharge pipe 64 is inserted into the second discharge port 62. The second discharge pipe 64 extends between the outside of the second case portion 22 and the second internal space S2 via the second discharge port 62. The coolant is discharged from the second internal space S2 to the outside of the second case portion 22 via the second discharge pipe 64. An upstream end of the second discharge pipe 64 is connected to the battery unit 16. Thus, the coolant is discharged from the battery unit 16 to the second discharge pipe 64. The coolant that has cooled the interior of the battery unit 16 is discharged from the battery unit 16 to the second discharge pipe 64.

In the present embodiment, the coolant supplied to the second internal space S2 via the second supply port 61 and discharged from the second internal space S2 via the second discharge port 62 is, for example, an insulating LLC. The insulating LLC has a higher electrical resistance than a normal LLC, and thus has a high insulating property. Therefore, in the present embodiment, the coolant supplied to and discharged from the battery unit 16 has a higher insulating property than the coolant supplied to and discharged from the power conversion device 15.

The upstream end of the second supply pipe 63 and the downstream end of the second discharge pipe 64 may be connected to a second pump (not shown) and a second radiator (not shown). The coolant flows through the second supply pipe 63 and the second discharge pipe 64 by the driving of the second pump. The coolant is cooled by, for example, the relative wind of the passenger car 11 when flowing through the second radiator. The coolant may circulate, for example, through the second radiator, the second pump, the second supply pipe 63, the battery unit 16, and the second discharge pipe 64 in that order.

The second case portion 22 has a second case opening portion 55*h* that opens upward. The second case opening portion 55*h* is, for example, a rectangular opening. The second case opening portion 55*h* is defined by the upper end of the second tubular portion 55. The second case portion 22 includes a third flange portion 56 extending from the upper ends of the fourth side wall 51 and the two fifth side walls 52. The third flange portion 56 extends, for example, to be orthogonal to the up-down direction.

The cover member 54 is provided above the second case opening portion 55*h* and above the upper wall 34. The cover member 54 includes a cover main body portion 54*a*, a cover extension portion 54*b*, and a cover flange portion 54*c*. The cover main body portion 54*a* has, for example, a rectangular flat plate shape and is arranged to be orthogonal to the up-down direction. The cover main body portion 54*a* overlaps the second case opening portion 55*h* and the upper wall 34 when viewed from above. The cover flange portion 54*c* has, for example, a rectangular flat plate shape and is arranged to be orthogonal to the up-down direction. The cover flange portion 54*c* overlaps the upper wall 34 and the third flange portion 56 in the up-down direction. The cover extension portion 54*b* extends in the up-down direction from the cover main body portion 54*a*. The cover extension portion 54*b* connects an outer peripheral edge of the cover main body portion 54*a* to an inner peripheral edge of the cover flange portion 54*c*.

The height of the upper end of the battery unit 16 and the height of the upper end of the power conversion device 15 are the same. Thereby, the cover member 54 positioned above the power conversion device 15 and the battery unit 16 can be made closer to a flat shape. This prevents bulging portion from being formed by the power supply system 10 on the floor portion of the passenger compartment 12 positioned above the cover member 54.

A second seal member 42 is provided between the cover flange portion 54*c* and the upper wall 34 and between the cover flange portion 54*c* and the third flange portion 56. The second seal member 42 has the shape of an endless loop, and has, for example, a rectangular shape when viewed in the up-down direction. The second seal member 42 provide a seal between the cover flange portion 54*c* and the upper wall 34 and between the cover flange portion 54*c* and the third flange portion 56. Thus, the second internal space S2 is defined inside the second case portion 22.

A portion of the second internal space S2 between the cover member 54 and the upper wall 34 is positioned above the first case portion 21 and faces the connecting hole 34*h* in the up-down direction. Therefore, the connecting hole 34*h* connects the first internal space S1 and the second internal space S2 to each other.

Component and Material of Case

The upper wall 34 of the first case portion 21, the lower wall 53 of the second case portion 22, and the second side wall 32, which is a partition wall portion, are formed of a single member that is continuous without a break. In the present embodiment, in addition to the upper wall 34, the lower wall 53, and the second side wall 32, the first side wall 31, the two third side walls 33, the fourth side wall 51, the two fifth side walls 52, the first flange portion 36, and the third flange portion 56 are formed of a case member 45 which is a single member that is continuous without a break. That is, the case 20 of the present embodiment is formed of the case member 45 and the cover member 54. The case member 45 is formed by, for example, drawing processing.

The case member 45 and the cover member 54 may be formed of the same metal or different metals. The case member 45 may be formed of a metal having a higher rigidity than the cover member 54. In this case, the rigidity of the case member 45 to which the power conversion device 15 and the battery unit 16 are fixed can be increased.

Lid Member

The power supply system 10 includes a lid member 57 capable of opening and closing the opening portion 35*h*. The lid member 57 has, for example, a rectangular flat plate shape and is arranged to be orthogonal to the up-down direction. The lid member 57 is positioned below the first flange portion 36 and the opening portion 35*h* and is positioned forward of the main body portion 53*a*. The lid member 57 overlaps the opening portion 35*h* when viewed from below.

The lid member 57 is, for example, removably fixed to the case 20. The lid member 57 is fixed to the case 20 in a state of closing the opening portion 35*h*. The opening portion 35*h* is opened to the outside of the case 20 by the lid member 57 being removed from the case 20 by an operator. The lid member 57 can be repeatedly attached to and removed from the case 20 by the operator.

A third seal member 43 is provided between the lid member 57 and the first flange portion 36. The third seal member 43 has the shape of an endless loop, and has, for example, a rectangular shape when viewed in the up-down direction. The third seal member 43 provides a seal between the lid member 57 and the first flange portion 36. Thus, the first internal space S1 is defined inside the first case portion 21 in a state in which the opening portion 35*h* is closed by the lid member 57.

Operation of Embodiment

Operation of the present embodiment will be described.

If the coolant leaks from the first supply pipe 39 or the first discharge pipe 40 to the first internal space S1, the coolant may accumulate in the first internal space S1. In a case in which the coolant has accumulated in the first internal space S1, the accumulated coolant is indicated by the long-dash double-short-dash line in FIG. 2 as water W. The water W accumulates from below the first internal space S1 at an upper portion of the opening portion 35*h* which is closed by the lid member 57. The connecting hole 34*h* is positioned above the opening portion 35*h*. Therefore, even if the water W has accumulated in the first internal space S1, the water W is less likely to reach the connecting hole 34*h*.

The opening portion 35*h* opens downward. The power supply system 10 includes a lid member 57 capable of opening and closing the opening portion 35*h*. Therefore, even if the water W has accumulated in the first internal space S1, the water W can be discharged from the first internal space S1 to the outside of the case 20 by opening the opening portion 35*h* by the lid member 57.

Advantages of Embodiment

The advantages of the present embodiment will be described.

(1) The first case portion 21 has the opening portion 35*h* that opens downward. The connecting hole 34*h* is positioned above the opening portion 35*h*. The power supply system 10 includes a lid member 57 capable of opening and closing the opening portion 35*h*. Therefore, even if the water W has accumulated in the first internal space S1, the water W is less likely to reach the connecting hole 34*h*. The water W can be discharged from the first internal space S1 to the outside of the case 20 by opening the opening portion 35*h* by the lid member 57. Thus, the water W which has accumulated in the first internal space S1 is less likely to leak into the second internal space S2 through the connecting hole 34*h*. This prevents the water W from leaking from the first internal space S1 housing the power conversion device 15 to the second internal space S2 housing the battery unit 16.

(2) The connecting hole 34*h* is provided in the upper wall 34, which is the upper portion of the first case portion 21. Therefore, the position of the connecting hole 34*h* is higher than in a case in which the connecting hole 34*h* is provided in a wall portion other than the upper wall 34 of the first case portion 21. Therefore, even if the water W has accumulated in the first internal space S1, the water W is less likely to reach the connecting hole 34*h*. This further reliably prevents the water W from leaking from the first internal space S1 housing the power conversion device 15 to the second internal space S2 housing the battery unit 16.

(3) The first case portion 21 includes the first supply port 37 for supplying the coolant which cools the power conversion device 15 from the outside of the first internal space S1 to the inside of the first internal space S1, and the first discharge port 38 for discharging the coolant from the inside of the first internal space S1 to the outside of the first internal space S1. Therefore, compared to a case in which the first case portion 21 does not have the first supply port 37 or the first discharge port 38, the water W is more likely to accumulate in the first internal space S1 to the extent that the coolant is supplied and discharged between the inside of the first internal space S1 and the outside of the first internal space S1. In the power supply system 10, in which the water W is likely to accumulate in the first internal space S1, the water W is prevented from leaking from the first internal space S1 housing the power conversion device 15 to the second internal space S2 housing the battery unit 16.

(4) The power conversion device 15 includes the relay 18 that switches between execution and stop of supply of electric power from the power conversion device 15 to the battery unit 16. The relay 18 is positioned at the upper portion in the power conversion device 15. Therefore, the water W accumulated in the first internal space S1 is less likely to reach the relay 18, as compared with a case in which the relay 18 is positioned at a lower portion in the power conversion device 15. Therefore, it is possible to suppress the influence on the power supply to the battery unit 16 due to the relay 18 being wet.

(5) The second side wall 32, which is a partition wall portion, forms both a portion of the first case portion 21 and a portion of the second case portion 22, and connects the upper wall 34, which is an upper portion of the first case portion 21, to the lower wall 53, which is a lower portion of the second case portion 22. Therefore, the portion of the first case portion 21 can be common with the portion of the second case portion 22. Therefore, the space for arranging the case 20 is reduced as compared with the case in which each of the first case portion 21 and the second case portion 22 includes a portion corresponding to the second side wall 32 which is a separate member.

(6) The upper wall 34 of the first case portion 21, the lower wall 53 of the second case portion 22, and the second side wall 32, which is the partition wall portion, are formed of a single member that is continuous without a break. In a case in which each of the upper wall 34, the lower wall 53, and the second side wall 32 which is the partition wall portion is a separate member, an operation of integrating these members is required. In this respect, such an operation is not required in the present embodiment. Therefore, the number of steps for manufacturing the case 20 is reduced.

(7) The opening portion 35*h* is opened by the lid member 57, and thus the operator can access the first internal space S1 from the outside of the case 20. Therefore, the power conversion device 15 in the first internal space S1 can be inspected. Also, the power conversion device 15 can be taken out from the first internal space S1 to the outside of the case 20 to install a new power conversion device 15. Therefore, the opening portion 35_h_ can be used for discharging the water W from the first internal space S1 to the outside of the case 20, and can also be used for allowing the operator to access the first internal space S1.

(8) The coolant supplied to and discharged from the battery unit 16 has a higher insulating property than the coolant supplied to and discharged from the power conversion device 15. Therefore, if the coolant leaks from the first internal space S1 to the second internal space S2 through the connecting hole 34_h_, an internal short-circuit of the battery unit 16 may occur. According to the present embodiment, the occurrence of internal short-circuit of the battery unit 16 is prevented by suppressing the leakage of the coolant from the first internal space S1 housing the power conversion device 15 to the second internal space S2 housing the battery unit 16.

Modifications

The above-described embodiment may be changed as described below. The above-described embodiment and the following modifications can be combined as long as the combined modifications remain technically consistent with each other.

Figure 3:
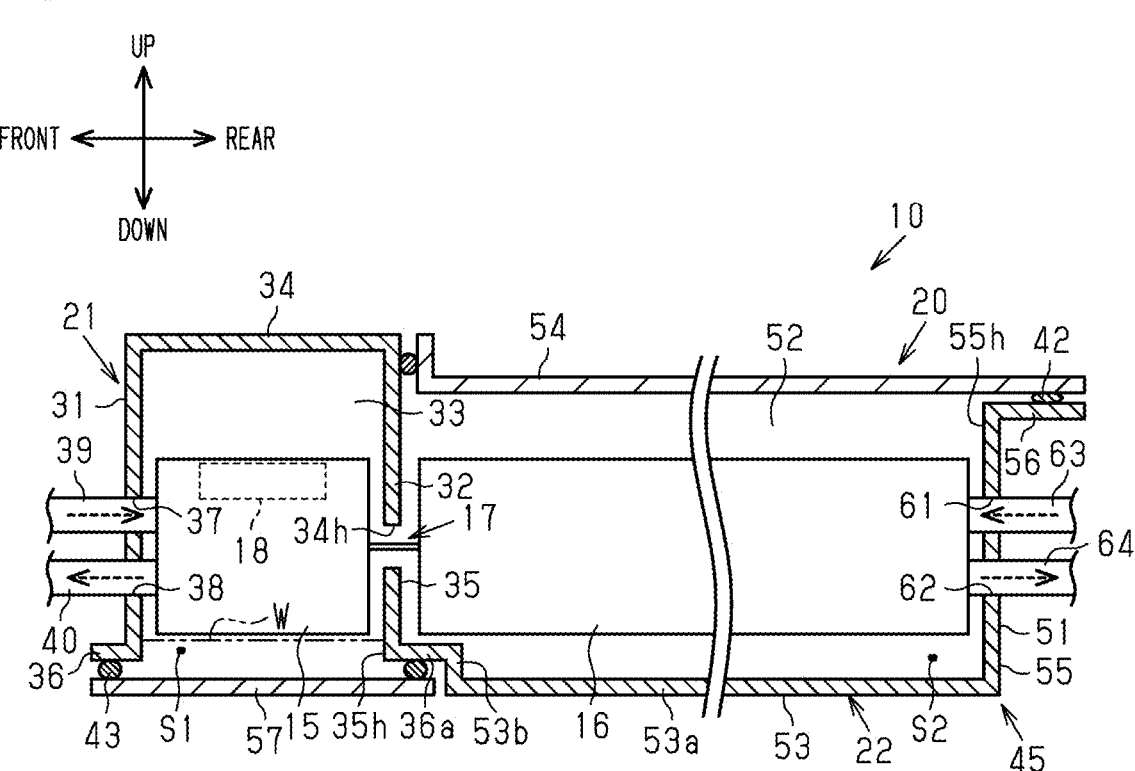
FIG. 3 is a cross-sectional view showing a power supply system according to a modification.

As shown in FIG. 3, the connecting hole 34_h_ may be provided in a wall portion other than the upper wall 34 of the first case portion 21. In the example shown in FIG. 3, the connecting hole 34_h_ is provided in the second side wall 32. The wiring 17 extends between the first internal space S1 and the second internal space S2 via the connecting hole 34_h_ formed in the second side wall 32. In this modification, the connecting hole 34_h_ is also positioned above the opening portion 35_h_. In this modification, the connecting hole 34_h_ may be closed by at least one of the power conversion device 15 and the battery unit 16.

In the above modification, the terminal block 19 may be added to the power supply system 10. In this case, the terminal block 19 is provided between the power conversion device 15 and the second side wall 32. The first seal member 41 is provided between the terminal block 19 and the second side wall 32 to provide a seal between the terminal block 19 and the second side wall 32. Thus, the connecting hole 34_h_ of the above modification is closed from the inside of the first case portion 21 by the first seal member 41 and the terminal block 19.

In the embodiment, the terminal block 19 may be omitted from the power supply system 10. In this case, the first seal member 41 that provides a seal between the terminal block 19 and the first case portion 21 is omitted. In this case, the connecting hole 34_h_ may be closed by at least one of the power conversion device 15 and the battery unit 16.

The size of the opening portion 35_h_ formed in the first case portion 21 is not limited to a size that allows the power conversion device 15 to be taken out from the inside of the first case portion 21 to the outside of the case 20 via the opening portion 35_h_. For example, the size of the opening portion 35_h_ formed in the first case portion 21 may be set to a size that allows the operator to access the first internal space S1 from the outside of the case 20 via the opening portion 35_h_. In short, the size of the opening portion 35_h_ formed in the first case portion 21 may be any size if the size is large enough to allow the water W accumulated in the first internal space S1 to be discharged to the outside of the case 20 via the opening portion 35_h_.

The power conversion device 15 may be fixed to the lid member 57.

The battery unit 16 may be fixed to the cover member 54.

The power supply system 10 may further include a sensor that detects the amount of the water W accumulated in the first internal space S1. In this case, for example, the control unit may give a notification on condition that the amount of the water W detected by the sensor is greater than or equal to a predetermined amount. This prompts the operator to open the lid member 57.

The height of the upper end of the battery unit 16 and the height of the upper end of the power conversion device 15 may be different from each other.

At least two of the upper wall 34 of the first case portion 21, the lower wall 53 of the second case portion 22, and the second side wall 32 which is the partition wall portion may be different members.

The partition wall portion is not limited to a portion that forms both a part of the first case portion 21 and a part of the second case portion 22. For example, each of the first case portion 21 and the second case portion 22 may have a partition wall portion as a separate member, and the first internal space S1 and the second internal space S2 may be separated from each other by these partition wall portions.

The position of the relay 18 in the power conversion device 15 is not limited to the upper portion in the power conversion device 15. For example, the relay 18 may be positioned at a lower portion in the power conversion device 15.

The coolant supplied to and discharged from the battery unit 16 may be the same type of coolant as the coolant supplied to and discharged from the power conversion device 15.

The second supply pipe 63 and the second discharge pipe 64 may be omitted from the power supply system 10. In this case, the coolant may be supplied from the second supply port 61 to the second internal space S2, and the coolant in the second internal space S2 may be discharged from the second discharge port 62 to the outside of the case 20.

At least one of the second supply port 61 and the second discharge port 62 may be provided in any one of the two fifth side walls 52, the lower wall 53, and the cover member 54. The second supply port 61 and the second discharge port 62 may be provided in different wall portions among the fourth side wall 51, the two fifth side walls 52, the lower wall 53, and the cover member 54. The second supply port 61 and the second discharge port 62 may be omitted from the second case portion 22.

A detection means for detecting water leakage may be provided in the first case portion 21, and the control unit may perform control to notify a host system of a water leakage when the detection means detects the water leakage. The detection means is, for example, a sensor. In this case, the host system can stop the passenger car 11 or take measures against an anomaly during a period from when the water W leaks into the first internal space S1 to when the water W enters the second internal space S2.

The first supply pipe 39 and the first discharge pipe 40 may be omitted from the power supply system 10. In this case, the coolant may be supplied from the first supply port 37 to the first internal space S1, and the coolant in the first internal space S1 may be discharged from the first discharge port 38 to the outside of the case 20.

At least one of the first supply port 37 and the first discharge port 38 may be provided in any one of the two third side walls 33 and the upper wall 34. The first supply port 37 and the first discharge port 38 may be provided in different wall portions among the first side wall 31, the two third side walls 33, and the upper wall 34. The first supply port 37 and the first discharge port 38 may be omitted from the first case portion 21.

The power conversion device 15 may be positioned behind the battery unit 16. In this case, the positional relationship between the first case portion 21 and the second case portion 22 of the case 20 may be reversed in the front-rear direction in the embodiment.

The power conversion device 15 and the battery unit 16 may be arranged side by side in the left-right direction.

The power supply system 10 may be mounted on a vehicle other than the passenger car 11. The vehicle in this case may be an industrial vehicle, for example.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A power supply system configured to supply electric power to a vehicle, the power supply system comprising:
   a power conversion device;
   a battery unit that is electrically connected to the power conversion device via a wiring; and
   a case, wherein
   the case includes:
       a first case portion that defines a first internal space for housing the power conversion device;
       a second case portion that defines a second internal space for housing the battery unit; and a partition wall portion that separates the first internal space and the second internal space from each other and has a connecting hole that connects the first internal space and the second internal space to each other,
   the wiring extends between the first internal space and the second internal space via the connecting hole,
   the first case portion has an opening portion that opens downward,
   the connecting hole is positioned above the opening portion, and
   the power supply system further comprising a lid member that is capable of opening and closing the opening portion.

2. The power supply system according to claim 1, wherein the connecting hole is provided in an upper wall of the first case portion.

3. The power supply system according to claim 1, wherein the first case portion includes:
   a supply port configured to supply a coolant for cooling the power conversion device from an outside of the first internal space to an inside of the first internal space; and
   a discharge port configured to discharge the coolant from the inside of the first internal space to the outside of the first internal space.

4. The power supply system according to claim 1, wherein the power conversion device includes a relay configured to switch between execution and stop of supply of electric power from the power conversion device to the battery unit, and
   the relay is positioned at an upper portion in the power conversion device.

5. The power supply system according to claim 1, wherein the partition wall portion forms both a part of the first case portion and a part of the second case portion, and connects an upper wall of the first case portion to a lower wall of the second case portion.

6. The power supply system according to claim 5, wherein the upper wall of the first case portion, the lower wall of the second case portion, and the partition wall portion are formed of a single member that is continuous without a break.

* * * * *